(12) United States Patent
Nakanishi

(10) Patent No.: US 8,463,562 B2
(45) Date of Patent: Jun. 11, 2013

(54) DEVICE AND METHOD FOR DETECTING ABNORMALITY OF ELECTRIC STORAGE DEVICE

(75) Inventor: Toshiaki Nakanishi, Toyohashi (JP)

(73) Assignee: Panasonic EV Energy Co., Ltd., Kosai-shi (JP)

( * ) Notice: Subject to any disclaimer, the term of this patent is extended or adjusted under 35 U.S.C. 154(b) by 578 days.

(21) Appl. No.: 12/525,069

(22) PCT Filed: Feb. 6, 2008

(86) PCT No.: PCT/JP2008/051911
§ 371 (c)(1),
(2), (4) Date: Jul. 29, 2009

(87) PCT Pub. No.: WO2008/096771
PCT Pub. Date: Aug. 14, 2008

(65) Prior Publication Data
US 2010/0004885 A1    Jan. 7, 2010

(30) Foreign Application Priority Data

Feb. 8, 2007  (JP) ................................ 2007-029524
Apr. 18, 2007 (JP) ................................ 2007-109165

(51) Int. Cl.
G01R 31/36 (2006.01)
H02J 7/00 (2006.01)
G01N 27/416 (2006.01)

(52) U.S. Cl.
USPC ............................. 702/63; 320/120; 324/434

(58) Field of Classification Search
USPC ........... 702/63, 57–60, 64–68, 70–73, 75–77, 702/80–81, 84, 127, 179, 182–183, 185, 702/188–189, 193, 199; 324/76.11, 76.19, 324/76.29, 426, 430, 433–434, 500, 512, 324/519–522, 525, 548, 600, 606; 320/112, 320/116, 120; 322/20, 22–25, 27
See application file for complete search history.

(56) References Cited

U.S. PATENT DOCUMENTS 4,876,513 A  10/1989 Brilmyer et al.
5,193,067 A  3/1993 Sato et al.
(Continued)

FOREIGN PATENT DOCUMENTS

CN  1474493 A  2/2004
CN  1890574 A  1/2007
(Continued)

OTHER PUBLICATIONS

Nakayama, JP 2000-150002 (English Version), Mar. 30, 2012, 5 pp.*

(Continued)

*Primary Examiner* — Toan Le
(74) *Attorney, Agent, or Firm* — Christensen, O'Connor Johnson Kindness PLLC

(57) ABSTRACT

Provided is an abnormality detecting device for detecting an abnormality of electric storage devices such as a battery pack. Comparators (140-1) to (140-*n*) detect a time when a voltage reaches a prescribed voltage, for each block of a battery pack (100). A judging section (160) detects a current at a time when the voltage reaches the prescribed voltage, and a representative current value is calculated for each block. The deviation of the representative current value of each block is compared with the threshold value, and when the deviation is large, it is judged that there are abnormalities such as short-circuiting, minute short-circuiting, IR (internal resistance) increase, capacitance reduction, and the like.

14 Claims, 14 Drawing Sheets

U.S. PATENT DOCUMENTS

| | | | |
|---|---|---|---|
| 5,539,318 | A | 7/1996 | Sasaki |
| 6,020,743 | A | 2/2000 | Reeves et al. |
| 6,278,257 | B1 | 8/2001 | Takada et al. |
| 6,285,161 | B1* | 9/2001 | Popescu .................. 320/118 |
| 6,486,637 | B1 | 11/2002 | Nakanishi et al. |
| 7,129,707 | B2 | 10/2006 | Kikuchi |
| 2004/0239333 | A1 | 12/2004 | Kikuchi |
| 2005/0194936 | A1 | 9/2005 | Cho |
| 2010/0023285 | A1 | 1/2010 | Nakanishi |

FOREIGN PATENT DOCUMENTS

| | | |
|---|---|---|
| DE | 4004413 A1 | 8/1990 |
| EP | 1 085 592 A2 | 3/2001 |
| EP | 1 463 144 A1 | 9/2004 |
| JP | 3-63582 A | 3/1991 |
| JP | 6-34727 A | 2/1994 |
| JP | 10-106631 A | 4/1998 |
| JP | 10-255856 A | 9/1998 |
| JP | 11-23676 A | 1/1999 |
| JP | 3006293 B2 | 2/2000 |
| JP | 2000-150002 A | 5/2000 |
| JP | 2000-294299 A | 10/2000 |
| JP | 2001-196102 A | 7/2001 |
| JP | 2003-151643 A | 5/2003 |
| JP | 2004-271445 A | 9/2004 |
| JP | 2005-168259 A | 6/2005 |
| JP | 2005-195604 A | 7/2005 |
| JP | 3936048 B2 | 6/2007 |
| JP | 2008-286781 A | 11/2008 |
| WO | 90/06522 A1 | 6/1990 |

OTHER PUBLICATIONS

Drawings of JP 2000-150002, Mar. 30, 2012, 2 pp.*

International Search Report dated May 20, 2008, issued in corresponding International Application No. PCT/JP2008/051911, filed Feb. 6, 2008.

Extended European Search Report mailed Jan. 6, 2012, issued in corresponding European Application No. EP 08 70 4482.2, filed Feb. 6, 2008, 7 pages.

Notification of First Office Action mailed Dec. 22, 2011, issued in corresponding Chinese Application No. 200880004396.X, 13 pages.

Notification of the Second Office Action, mailed Oct. 26, 2012, issued in corresponding Chinese Application No. 200880004396, filed Jan. 6, 2008, 18 pages.

Notice of Grounds for Rejection, mailed Dec. 4, 2012, issued in related Japanese Application No. 2008-025868, filed Feb. 6, 2008, with English translation provided by foreign associate, 4 pages.

* cited by examiner

| ΔIn | | Δldif | | | | DETERMI-NATION |
|---|---|---|---|---|---|---|
| ΔI1>A | ΔI2>A | Δldif1<-A | Δldif1>A | Δldif2<-A | Δldif2>A | |
| Yes | Yes | Yes | / | Yes | / | SHORT-CIRCUITING |
| Yes | / | Yes | / | / | / | MINUTE SHORT-CIRCUITING CAPACITANCE REDUCTION (EXCESSIVE DISCHARGE) |
| Yes | Yes | Yes | / | / | Yes | IR INCREASE TEMPERATURE INCREASE CAPACITOR CAPACITANCE REDUCTION |
| / | Yes | / | / | / | Yes | CAPACITANCE REDUCTION (EXCESSIVE CHARGE) |

FIG. 11

DEVICE AND METHOD FOR DETECTING ABNORMALITY OF ELECTRIC STORAGE DEVICE

TECHNICAL FIELD

The present invention relates to a device, a method, and a program for detecting abnormality of an electric storage device, and in particular, to a technique for detecting abnormality of an electric storage device such as a battery pack which comprises a plurality of blocks connected in series.

BACKGROUND ART

In the related art, a battery pack in which a block is constructed by connecting one or a plurality of batteries in series and a plurality of the blocks are connected in series is equipped in a hybrid automobile and an electric automobile, and a device for measuring voltage or current of each block of the battery pack and detecting abnormality has been developed. A basic method of detection of the abnormality is that a voltage and a current are measured for each block and an internal resistance (IR) is calculated through the method of least squares. The abnormality is detected based on an increase or a deviation of IR.

FIG. 12 shows a result of a plot of current against voltage for a block obtained through measurement, with the horizontal axis representing the current and the vertical axis representing the voltage (block voltage). In FIG. 12, the X mark represents each measurement point. A straight line 50 is a straight line obtained by the method of least squares based on the plurality of measurement points, and the slope of the straight line represents the IR. For each block of the battery pack, a straight line is calculated, and when the straight lines are in an allowable range, the battery pack is determined to be normal. On the other hand, as shown in FIG. 13, when a straight line 60 of a certain block has a large deviation with respect to the straight lines 50 of the other blocks when the straight lines are calculated through the method of least squares for each block, the abnormality of the battery pack is detected by determining that IR has increased due to elapse of the lifespan, compromising of airtightness, etc.

JP 2001-196102 A discloses a technique of detecting abnormal increase in temperature of the battery in which the IR of each block is calculated based on the block voltage and the current and the IR is compared with a predetermined threshold value. FIG. 14 shows a structure of the battery pack control device disclosed in this reference. The battery pack control device is equipped in a hybrid automobile. The battery pack control device controls input and output of a battery pack 10. The battery pack 10 comprises a plurality of blocks 10A which are connected in series. Each of the plurality of blocks 10A comprises a plurality of single batteries 10B which are connected in series. The battery pack control device comprises a battery power input and output section 1 which controls an input and an output of power of the battery pack 10, a block voltage detecting section 2 which detects a block voltage of each of the plurality of blocks 10A, a battery current detecting section 3 which detects a battery current of the battery pack 10, an abnormal temperature increase detecting section 4 which detects abnormal temperature increase of the single battery 10B based on the block voltage and the battery current, a vehicle control section 5 which controls the battery power input and output section 1 based on a detection result of abnormal temperature increase by the abnormal temperature increase detecting section 4, and a battery temperature detecting section 6 which detects a battery temperature of the battery pack 10. The abnormal temperature increase detecting section 4 comprises an internal resistance calculating section 4A which calculates an internal resistance of each of the plurality of blocks 10A based on the block voltage and the battery current, a threshold value setting section 4B which sets a threshold value based on the battery temperature of the battery pack 10, a variance calculating section 4C which calculates an average value and a variance $\sigma^2$ of the block voltage of each of the plurality of blocks 10A, a variance abnormal temperature increase detecting section 4D which detects an abnormal temperature increase of the single battery 10B based on the block voltage, average value, and variance $\sigma^2$ of each of the plurality of blocks 10A, and a remaining capacitance abnormal temperature increase detecting section 4E which detects abnormal temperature increase of the single battery 10B based on a remaining capacitance of each of the plurality of blocks 10A. The battery power input and output section 1 comprises an inverter 1A of a hybrid automobile and a motor generator 1B. The motor generator 1B drives an engine 12 through a transmission 11. An engine control section 13 controls the engine 12 based on an output of the vehicle control section 5. The vehicle control section 5 is connected to an acceleration pedal 7, a braking pedal 8, a shift lever 9, and a battery remaining capacitance detecting section 14. The vehicle control section 5 controls the battery power input and output section 1 based on a detection result of the abnormal temperature increase by the abnormal temperature increase detecting section 4.

JP 2005-195604 A discloses a technique in which a voltage of each of a plurality of batteries of a battery pack is measured at a predetermined time and the current flowing through the battery pack is measured at the same time, a difference between the maximum value and the minimum value of each voltage obtained through the measurement is calculated, and the abnormality of the battery pack is detected based on values of the pair of the current and the difference.

However, in the structure of measuring the block voltage and the current for each block, an A/D conversion is required for the block voltage, which may result in an increase in the cost. In addition, because the IR is calculated through the method of least squares based on the block voltage and the current, there is a problem in that the processing time is increase and the load of the processing program is increased due to the increase in the amount of calculation. In addition, when the speed of the calculation is increased in such a state, heat generation may result, which may prevent size reduction of the detection device.

DISCLOSURE OF INVENTION

The present invention provides a device and method which can quickly and accurately detect abnormality of an electric storage device such as a battery pack and a capacitor, with a simple structure.

According to one aspect of the present invention, there is provided a detecting device which detects abnormality of an electric storage device having a plurality of blocks which are connected in series, each block having one or a plurality of electric storage units, the detecting device comprising a measurement unit which measures, for each block, a current value at a time when a voltage of the block becomes equal to a predetermined voltage, and a detecting unit which detects abnormality of the electric storage device based on a deviation of the measured current value of each block.

According to another aspect of the present invention, there is provided a method of detecting abnormality of an electric storage device having a plurality of blocks which are connected in series, each block having one or a plurality of electric storage units, the method comprising the steps of measuring, for each block, a current value at a time when a voltage of the block becomes equal to a predetermined voltage, and detecting abnormality of the electric storage device by comparing a deviation of the measured current value of each block with a threshold value.

According to another aspect of the present invention, there is provided a recording medium storing a computer program for detecting abnormality of an electric storage device having a plurality of blocks which are connected in series, each block having one or a plurality of electric storage units, which, when executed, causes a computer to execute a process comprising measuring, for each block, a current value at a time when a voltage of the block becomes equal to a predetermined voltage, sequentially storing the measured current value of each block in a memory, causing a calculating device to calculate a representative current value of each block through a predetermined statistical process based on a plurality of current values of each block stored in the memory, causing the calculating device to calculate a deviation of the representative current value of each block obtained through the calculation, and detecting abnormality of the electric storage device by comparing in size the deviation obtained through the calculation and a threshold value.

According to another aspect of the present invention, there is provided a detecting device which detects abnormality of an electric storage device having a plurality of blocks which are connected in series, each block having one or a plurality of electric storage units, the detecting device comprising a measurement unit which measures a current value at a time when a voltage difference between adjacent blocks among the plurality of blocks becomes equal to a predetermined voltage, and a detecting unit which detects abnormality of the electric storage device based on a size of the measured current value.

According to various aspects of the present invention, abnormality of the electric storage device can be detected based on a current value at a predetermined time, with a small and simple structure and without detecting pairs of current and voltage.

BRIEF DESCRIPTION OF DRAWINGS

FIG. 11 is a table showing a relationship between a variation in current and abnormality mode.

BEST MODE FOR CARRYING OUT THE INVENTION

Preferred embodiments of the present invention will now be described.

Figure 1:
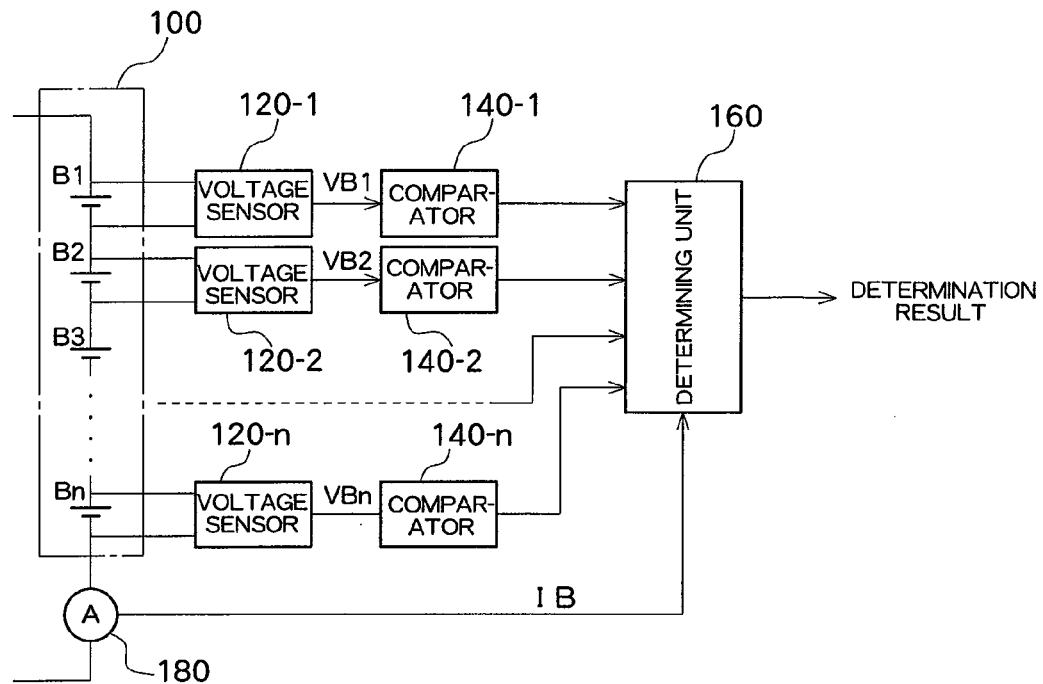
FIG. 1 is an overall structural diagram of an abnormality detecting device according to a preferred embodiment of the present invention.
Figure 14:
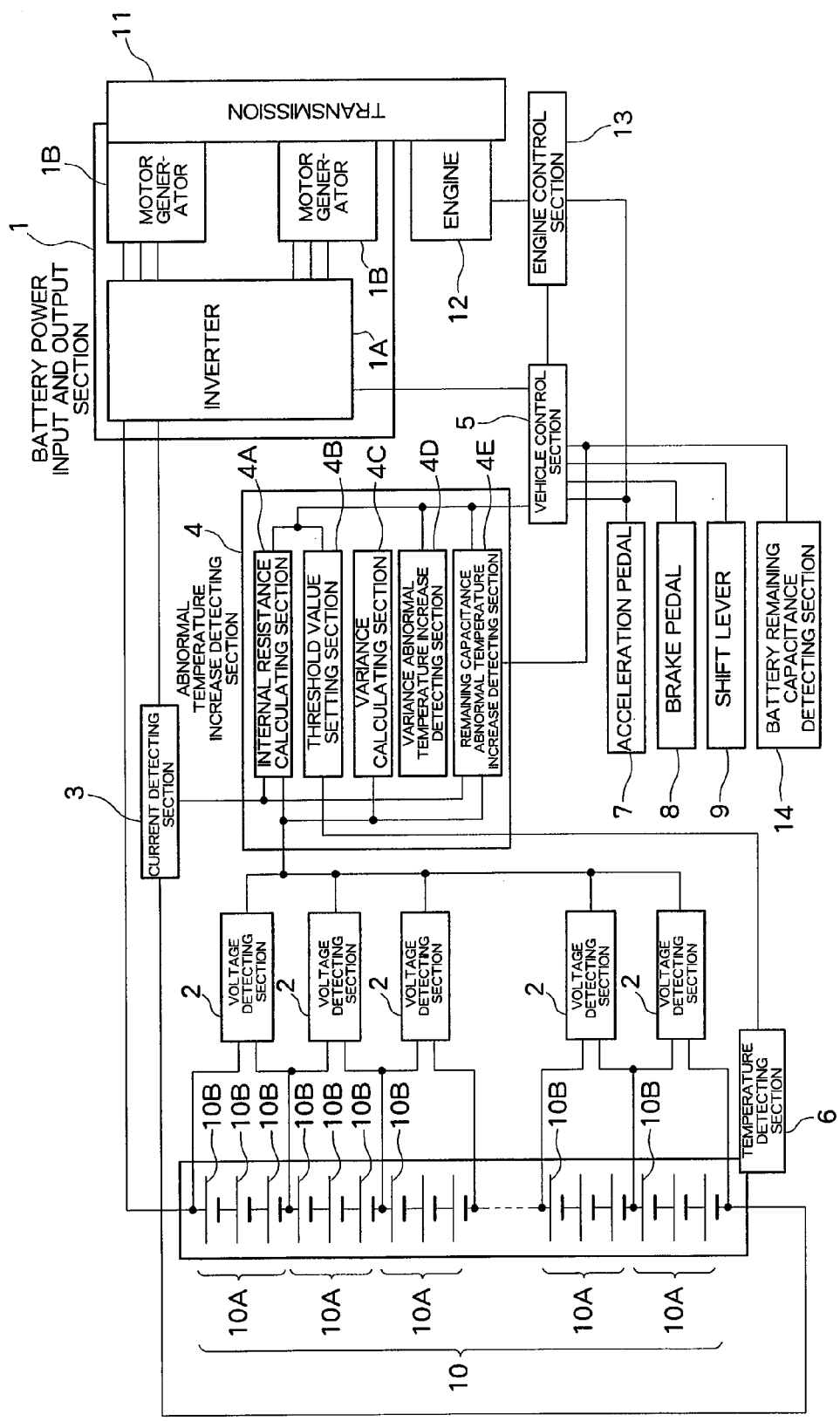
FIG. 14 is an overall structural diagram of a structure of the related art.

FIG. 1 shows a structure of an abnormality detecting device of a battery pack in the present embodiment. The abnormality detecting device is equipped in a hybrid automobile, similarly to the battery pack control device shown in FIG. 14, and detects abnormality of the battery pack. FIG. 1 does not show the battery power input and output section 1, the vehicle control section 5, the engine control section 13, etc. which are shown in FIG. 14, because these elements are similar to those in the structure of FIG. 14. These elements will not be described again.

In FIG. 1, a battery pack 100 which is an electric storage device comprises a plurality of blocks B1~Bn, and the blocks B1~Bn are connected in series. Each block comprises one or a plurality of single batteries connected in series. Each battery is, for example, a nickel metal hydride battery or lithium-ion battery.

Voltage sensors 120-1~120-$n$ detect block voltages VB1~VBn of the blocks B1~Bn of the battery cell 100, respectively. The detected block voltages VB1~VBn are supplied to comparators 140-1~140-$n$, respectively.

The comparators 140-1~140-$n$ compare the input block voltages VB1~VBn with a predetermined voltage, and determine whether or not the block voltages VB1~VBn have reached the predetermined voltage. When the block voltages VB1~VBn match the predetermined voltage, the comparators 140-1~140-0$n$ supply match signals to a determining unit 160. The predetermined voltage for determination in each comparator 140-1~140-$n$ has the same value. Therefore, when the block voltages VB1~VBn are approximately equal, the match signals are output at an approximately the same time from the comparators 140-1~140-$n$. When, on the other hand, the block voltages VB1~VBn are not equal to each other, the match signals are output from the comparators 140-1~140-$n$ at times corresponding to the values of the block voltages. The match signals which are output from the comparators 140-1~140$n$ function as sampling signals for defining a time of sampling of the current of the battery pack.

A current sensor 180 detects a current IB of the battery pack 100. The detected current IB is supplied to the determining unit 160.

The determining unit 60 samples the current IB supplied from the current sensor 180 at the times of the match signals supplied from the comparators 140-1~140-n, and stores the current values in a memory. Therefore, the memory stores current values at times when the block voltage VB1 of the block B1 has reached the predetermined voltage, current values at times when the block voltage VB2 of the block B2 has reached the predetermined voltage, ... current values at times when the block voltage VBn of the block Bn has reached the predetermined voltage. The determining unit 160 applies a statistical process on the sampling currents stored in the memory for each block, and sets a representative current value of each block. For example, an average value may be determined as the statistical process so that an average value of sampling currents for block B1 is calculated and set as a representative current value I1 of the block B1, an average value of the sampling currents for the block B2 is calculated and set as a representative current value I2 of the block b2, and an average value of the sampling currents for the block Bn is calculated and set as a representative current value In of the block Bn. The determining unit 160 also determines, based on the representative current values I1~In of the blocks calculated in the above-described manner, whether or not an abnormality has occurred in the battery pack 100 according to variation of the representative current values I1~In, and outputs the determination result.

Note that while in the related art pair data of the block voltage and the block current is detected, the IR of each block is calculated through the method of least squares or through a regression analysis, and the presence or absence of the abnormality is determined, in the present embodiment, the presence or absence of abnormality is determined based on the representative current values I1~In of the blocks.

The determining unit 160 may be formed with a micro-computer, and may be formed in an IC including the comparators 140-1~140-n.

Figure 2:
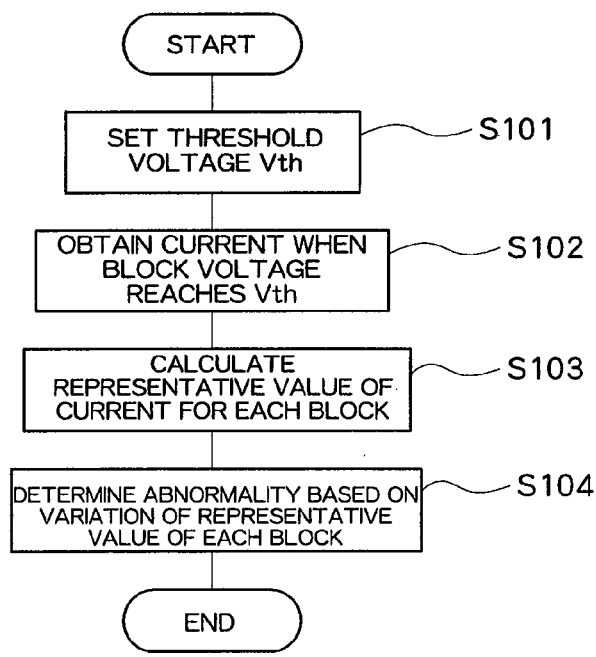
FIG. 2 is a process flowchart of a preferred embodiment of the present invention.

FIG. 2 is a flowchart of the abnormality determination process of the present embodiment. First, a threshold voltage Vth which is the predetermined voltage to be compared with the block voltages VB1~VBn in the comparators 140-1~140-n is set (S101). The method of setting the threshold voltage Vth is arbitrary, but it is desirable that the threshold voltage Vth be set to a predetermined value within a voltage change range when the battery pack 100 repeats charging and discharging as the vehicle runs, in order to allow a large number of current samplings in short period of time. The threshold voltage Vth may be set as an absolute value or may be set based on a ratio with respect to a reference SOC (state of charge) of the battery pack 100. The threshold voltage Vth as the predetermined voltage may be supplied to the comparators 140-1~140-n in advance or a configuration may be employed in which the threshold voltage Vth is registered in a register and then supplied to the comparators 140-1~140-n so that the threshold voltage Vth can be suitably adjusted by replacing the content of the register.

After the threshold voltage Vth is set (S101), the comparators 140-1~140-n compare the block voltages VB1~VBn to the threshold voltage Vth, and current values when the block voltages VB1~VBn have reached the threshold voltage Vth are obtained (S102). The obtained current value is sequentially stored in the memory for each block. Then, for each block, a representative value of the current is calculated (S103). The number of samples of the current to be obtained is arbitrary, and may be fixed at a predetermined value. Alternatively, the sampling time may be fixed. When the sampling time is fixed, there may be cases where the number of samples differs among blocks. The number of samples is at least two, and may be several tens. The representative value of each block is, in general, the average value as described above, but may alternatively be an intermediate value, a maximum value, or a minimum value. It is desirable, however, that the representative value be calculated based on the same standard for all blocks.

After the representative current value is calculated for each block, it is determined whether or not abnormality has occurred based on a degree of variation of the representative current value of each block (S104). The determination result is supplied to the vehicle control section similar to the related art, and the vehicle control section controls the power input and output section of the battery pack 100 or notifies the occupant of the vehicle of the abnormality of the battery pack.

The process of FIG. 2 can be realized by the micro-computer which is a part of the determining unit 160 or a part of the determining unit 160 and the comparators 140-1~140-n sequentially executing an abnormality diagnosis program stored in a ROM. The abnormality diagnosis program may be stored on a recording medium such as a CD-ROM and installed in a computer. Any type of recording medium for storage of the abnormality diagnosis program may be used, and the recording medium may be an arbitrary medium such as a CD-ROM, a DVD-ROM, a flash memory, etc. The current value of each block obtained in S102 is sequentially stored in a work memory of the micro-computer. In S103, the processor of the micro-computer reads the plurality of current values for each block stored in the memory, applies a predetermined statistical process, for example, an average value calculation process, and calculates the representative current value for each block. The calculated representative current value is again stored in the work memory. In S104, the processor of the micro-computer reads the representative current value for each block stored in the work memory and calculates a deviation. There exist several methods for calculation of the deviation. For example, a minimum value and a maximum value of the representative current values are extracted, and a difference is calculated or the variance $\sigma^2$ is calculated. Alternatively, the average of the representative current values may be calculated and a maximum difference value from the average value may be calculated. The calculated deviation is compared in size with the threshold value stored in the working memory, it is determined that an abnormality has occurred in a block having a representative current value exceeding the threshold value, and the determination result is output to the outside through an input and output interface. As the determination result, in place of the presence or absence of the abnormality, information for identifying the block in which the abnormality has occurred may be output.

Figure 3:
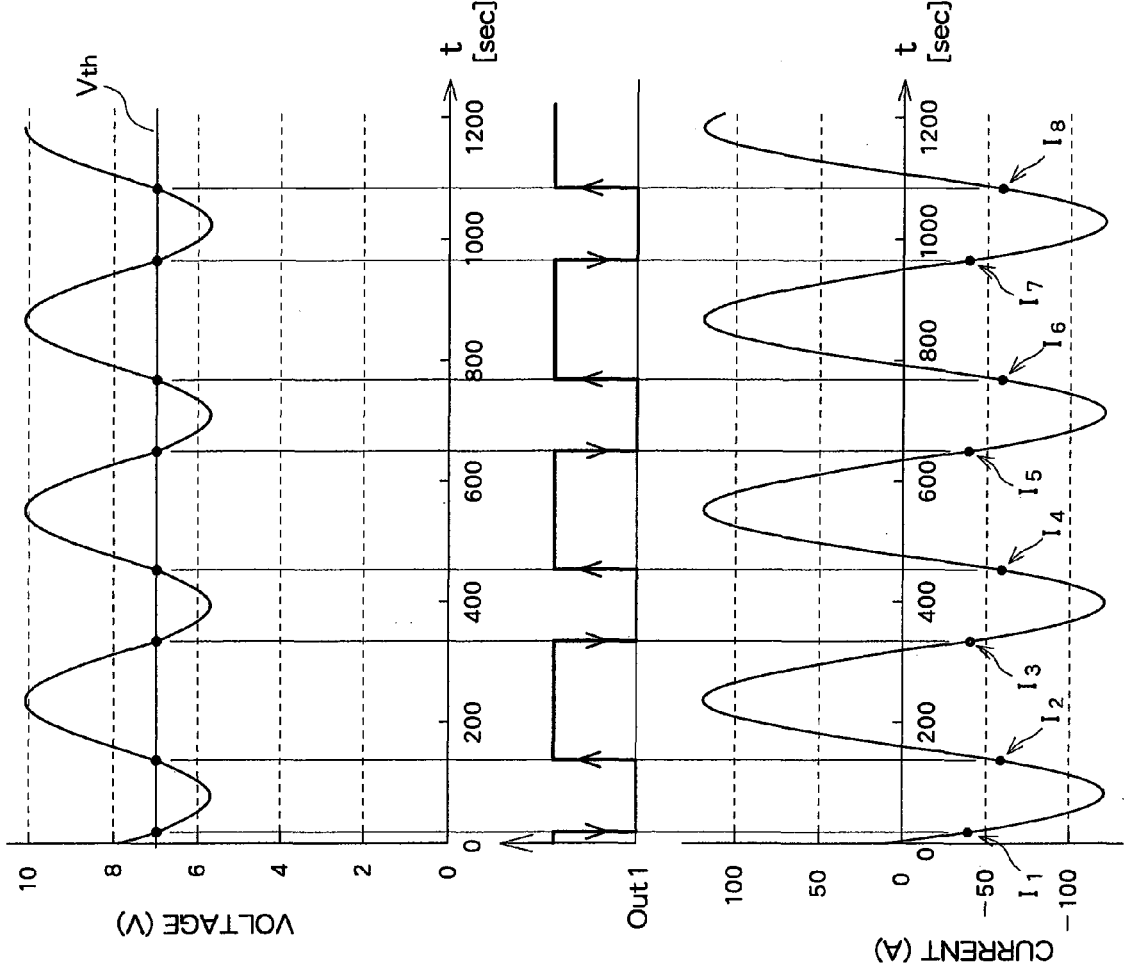
FIG. 3 is a timing chart showing a current sampling timing.

FIG. 3 shows a current sampling time for an arbitrary block Bi which is a part of the battery pack 100. FIG. 3(a) shows a change with respect to time of the block voltage detected by a voltage sensor 120-i. The horizontal axis represents time (s) and the vertical axis represents a voltage value (V). With repetition of charging and discharging, the block voltage also changes between approximately 6 V and approximately 10 V. FIG. 3 also shows the set threshold voltage Vth. In FIG. 3, the threshold voltage Vth is set to approximately 7 V. In FIG. 3, the block voltage and the threshold voltage Vth match at the times shown with black circles.

FIG. 3(b) shows a signal waveform of a result of comparison of the block voltage and the threshold voltage Vth at the comparator 140-i. If a configuration is employed in which the comparators 140-1~140-n compare the block voltages and the threshold voltage, and output a voltage signal of a Hi level when block voltage≧threshold voltage Vth, and output a voltage signal of a Low level when block voltage<threshold voltage, a square wave signal as shown in FIG. 3 is output. The times of the rise and fall of the square wave signal represent times when the block voltage and the threshold voltage Vth are equal. Therefore, the determining unit 160 samples, when the square wave signal as shown in FIG. 3(b) is input, the current IB at times synchronized with the the rise and fall of the square wave signal, so that the current at the time when the block voltage has reached the threshold voltage Vth can be obtained.

FIG. 3(c) shows a change with respect to time of the current detected by the current sensor 180. With the repetition of the charging and discharging, the current also changes to the positive side and the negative side (when the positive side is set as the charging, the negative side indicates discharging). The determining unit 160 samples the current IB at the time of the rise and fall of the square wave signal from the comparator 140-$i$ and obtains I1~I8. The obtained current values are sequentially stored in the memory, and a representative value of the current values I1~I8 is calculated. The representative current value for the block Bi is hereinafter referred to as IBi.

Figure 4:
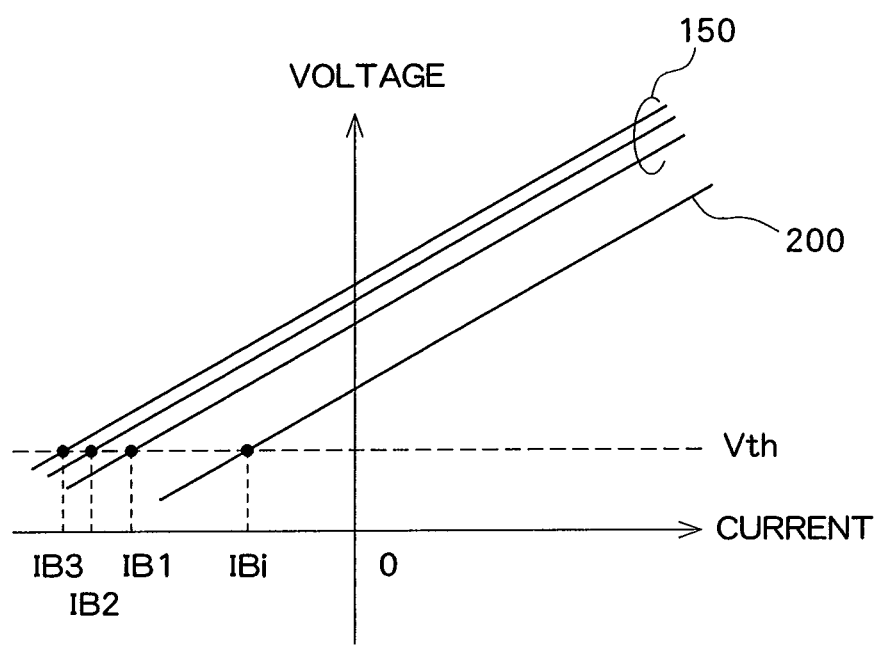
FIG. 4 is a graph showing a current-voltage characteristic when short-circuiting occurs.
Figure 12:
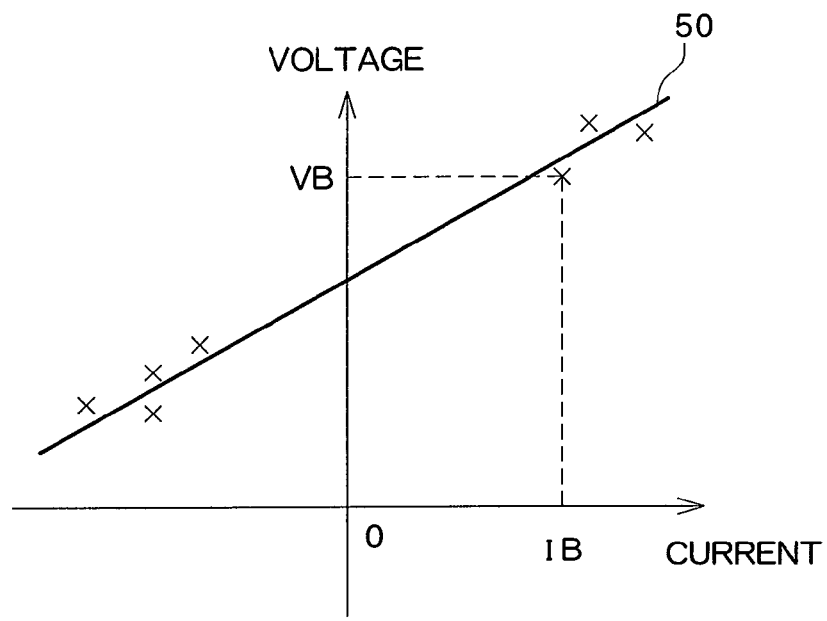
FIG. 12 is a graph showing a method of calculating IR in the related art.
Figure 13:
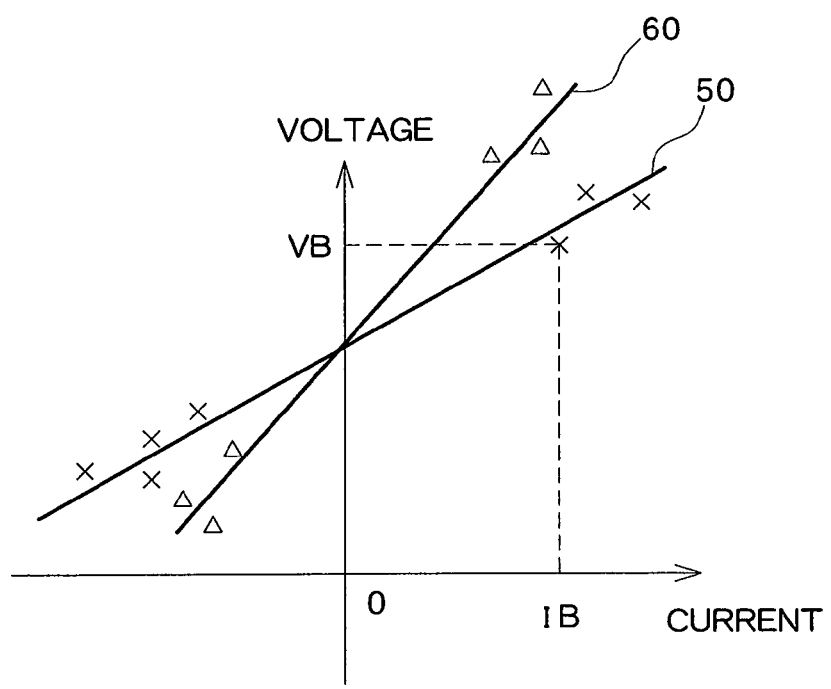
FIG. 13 is a graph showing a method of detecting abnormality of IR in the related art.

FIG. 4 is a diagram showing a plot of the representative current value calculated for each block, with the vertical axis representing the block voltage and the horizontal axis representing the current. Note that while the current-voltage characteristic is used in the related art for calculating the IR of each block, in the present embodiment, for the representative value, the current value at the threshold voltage Vth which is a particular voltage is plotted. In FIG. 4, the representative current value IB1 of the block B1, the representative current value IB2 of the block B2, the representative current value IB3 of the block B3, and the representative current value IBi of the block Bi are exemplified. The slope of the current-voltage characteristic is IR, and because each block has a unique IR, a straight line (or a curve) through the representative current values plotted for each block can be considered. In FIG. 4, a straight line through the plotted representative current values is shown. In the related art, as shown in FIG. 12, a plurality of pairs of current and voltage are detected and plotted, regression analysis is applied to calculate a straight line 50, and the slope of the straight line 50 is calculated as IR. The present embodiment, however, simply considers a straight line through the representative current values. The slope of the considered straight line would show the IR, but a straight line is considered assuming that the straight line has a predetermined slope. Then, based on the variation of the considered straight lines and, fundamentally, the variation in the representative current values of the blocks, the presence or absence of the abnormality is determined.

The abnormality modes of the battery pack 100 may include, for example, the followings:

(1) self short-circuiting (short-circuiting);

(2) minute short-circuiting (increase in self discharge and internal discharge);

(3) increase of IR (due to elapse of lifespan and compromised airtightness);

(4) capacitance reduction; and (5) temperature increase.

Of these, in (1) self short-circuiting, the pole plates inside the single battery (single cell) in the block contact each other and are short-circuited, and thus the OCV (Open Circuit Voltage) is also reduced. In the current-voltage characteristic, the intercept corresponding to the OCV, which is a voltage value when the current is 0, is reduced. In FIG. 4, the straight lines 150 and the straight line 200 have the same slope, but the intercept of the straight lines 150 and the intercept of the straight line 200 differ significantly from each other. This is due to a large variation between the representative current values IB1, IB2, and IB2 and the representative current value IBi. In this case, it is determined that the possibility that self short-circuiting has occurred in the block Bi corresponding to the representative current value IBi is high and that abnormality has occurred. More specifically, the variation (deviation) is compared in size with a predetermined value, and when the variation is less than or equal to the predetermined value, it is determined as normal, and when the variation is greater than the predetermined value, it is determined that abnormality has occurred. The degree of variation of the representative current values may be evaluated by an arbitrary evaluation equation. For example, the degree of variation may be evaluated by comparing, in size, the variance $\sigma^2$ with a predetermined value, or may be evaluated by comparing, in size, a difference between the maximum value and the minimum value of the representative current value with a predetermined value.

Figure 5:
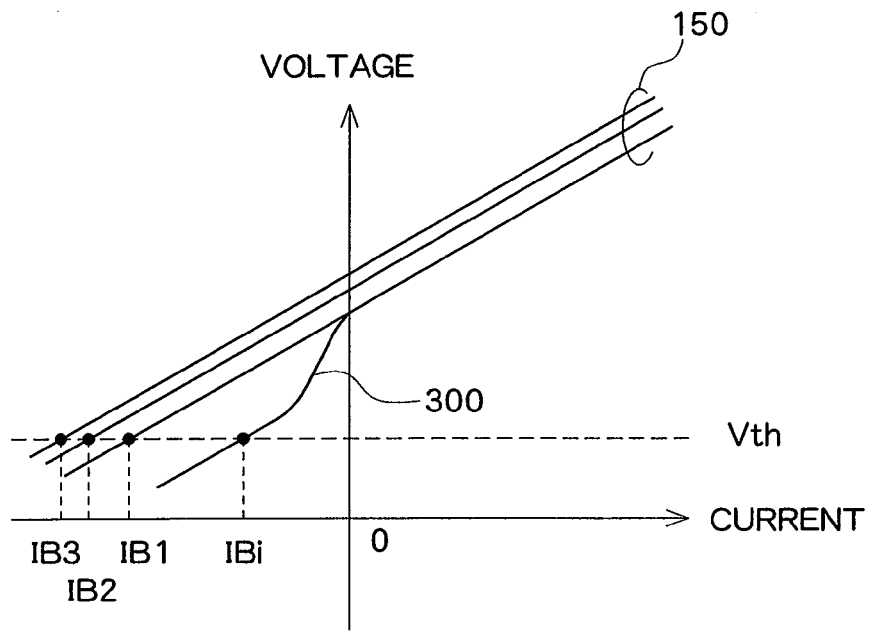
FIG. 5 is a graph showing a current-voltage characteristic when minute short-circuiting occurs.

In (2) minute short-circuiting, a metal deposit builds up inside the battery and a conductive path is formed between positive and negative poles, and the self discharge and internal discharge are increased. FIG. 5 shows a current-voltage characteristic for the case of the minute short-circuiting. Because the voltage is reduced during discharge, the voltage is reduced as shown with the straight line 300, compared to the normal straight lines 150. In this case also, the reduction is due to a large variation between the representative current values IB1, IB2, and IB3 and the representative current value IBi, and it is determined that the possibility that the minute short-circuiting has occurred in the block Bi corresponding to the representative current value IBi is high and that abnormality has occurred.

Figure 6:
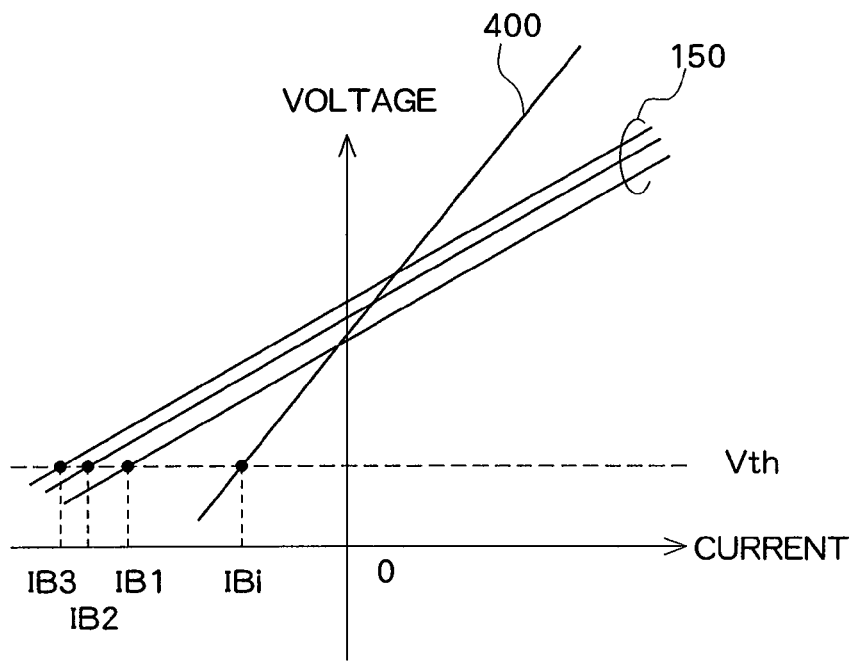
FIG. 6 is a graph showing a situation when IR is increased.

In (3) increase of IR, the slope of the current-voltage characteristic is increased. FIG. 6 shows a current-voltage characteristic for the case of increase in IR. The slope is increased as shown with a straight line 400 with respect to the normal straight lines 150. This is also caused by the large variation between the representative current values IB1, IB2, and IB3 and the representative current value IBi, and it is determined that the possibility that the increase in IR due to elapse of lifespan and compromising of airtightness has occurred in the block Bi corresponding to the representative current value IBi is high and that abnormality has occurred.

The (4) capacitance reduction is caused by repetition of the charging and discharging, and similar to the case of (2) minute short-circuiting, a characteristic as shown with a straight line 300 as opposed to the normal straight lines 150 is observed as shown in FIG. 5. This case also can be understood as having a large variation of the representative current value IBi with respect to the representative current values IB1, IB2, and IB3, and it is determined that the possibility that the capacitance reduction has occurred in the block Bi corresponding to the representative current value IBi is high and that abnormality has occurred.

The (5) temperature increase occurs as a result of the (3) increase of IR, and the slope is increased as shown with a straight line 400 compared to the normal straight lines 150, as shown in FIG. 6. This case also can be understood as having a large variation of the representative current value IBi with respect to the representative current values IB1, IB2, and IB3, and it is determined that the possibility that the temperature increase has occurred in the block Bi corresponding to the representative current value IBi is high and that abnormality has occurred.

As described, all of the abnormality modes of (1)-(5) can be evaluated by the size of the variation (deviation) of the representative current values IB1~IBn of the blocks, and when the variation of the representative current values IB1~IBn is within a predetermined range, no abnormality has occurred, and when the variation of the representative current values B1~Bn exceeds the predetermined range, it is possible to determine that abnormality of any one of (1)~(5) has occurred in the block corresponding to the representative current value exceeding the range. In the present embodiment, the normal/abnormality is not determined by comparing the representative current value of each block itself with the threshold value, but rather, the normal/abnormality is determined based on the variation of the representative current value. This is because it is difficult to suitably set the threshold value for determining abnormality because the electrochemical reaction of each block of the battery pack is easily affected by the temperature and a change from an initial state may occur in the block due to a memory effect, but it is difficult to completely predict this change.

In the present embodiment, it is possible to easily and quickly determine that abnormality of any of (1)-(5) has occurred based on the degree of variation of the representative current values B1~Bn of the blocks, and to determine the block among the blocks B1~Bn of the battery pack 100 where the abnormality has occurred, but it is not possible to identify which abnormality mode has occurred. Thus, it is also possible to employ a configuration in which, after it is determined that some abnormality has occurred, the type of abnormality is identified with the use of other parameters.

In addition, in the present embodiment a battery is used as the electric storage device, but the present embodiment can also be applied to a capacitor as the electric storage device. As the abnormality mode of the capacitor, of the above described abnormality modes (1)~(5), (4) capacitance reduction may occur. It is possible to compare the size of a variation (deviation) of the representative current value of each block forming a part of the capacitor with a predetermined range, and when the variation is large and exceeds the predetermined range, to determine that abnormality has occurred.

A preferred embodiment of the present invention has been described. The present invention, however, is not limited to such a configuration and various modifications may be made. A main point of the present invention is that the abnormality is detected not using the pair of current and voltage measured for each block, but based on the degree of variation of current among blocks at a predetermined time for each block (that is, a time when the voltage reaches a certain voltage), and includes an arbitrary abnormality detection technique which comprehensively uses other parameters in addition to the variation of the current among blocks at the predetermined time for each block. In the present embodiment, as the current at the predetermined time for each block, the current is measured at a time when the voltage reaches a certain voltage, but alternatively, it is also possible to employ a configuration in which two or more threshold voltages are provided, and the abnormality is comprehensively detected based on the variation of the current among blocks at a time when the voltage reaches the first threshold voltage for each block and based on the variation of the current among blocks at a time when the voltage reaches the second threshold voltage for each block. In other words, it is determined that abnormality has occurred when both the variation of the current among blocks at the time when the voltage has reached the first threshold value for each block and the variation of the current among blocks when the voltage has reached the second threshold value for each block exceed a threshold value. Alternatively, it is possible to determine abnormality when at least one of the variation of the current among blocks at the time when the voltage has reached the first threshold voltage for each block and the variation of the current among blocks at the time when the voltage has reached the second threshold voltage for each block exceeds the threshold value. The first and second threshold voltages may be arbitrarily set, and, for example, the first threshold voltage may be set as a threshold value at the discharge side and the second threshold voltage may be set as a threshold value at the charge side.

An example configuration in which two threshold voltages are provided and the abnormality is detected will now be described. When the abnormality is detected with one set threshold voltage, it is not possible to identify which of the abnormality modes (1)-(5) has occurred. With the provision of two threshold voltages, it becomes possible to identify which of the abnormality modes has occurred.

More specifically, in addition to the threshold voltage on the discharge side, a threshold voltage on the charge side is set. The threshold voltage on the discharge side is set as $Vth1$ and the threshold voltage on the charge side of is set as $Vth2$. Currents at the times when the voltage has reached the threshold voltages $Vth1$ and $Vth2$ are detected, and degrees of variation are evaluated for the discharge side and charge side. As the variation, a maximum value $\Delta I$ of the size of the variation among representative current of the blocks, and a variation $\Delta Idif = \Sigma IBj/n - IBi$, of the block $Bi$ in which the variation is maximum, from an average value among blocks, are used. The variations corresponding to the threshold voltage $Vth1$ of the discharge side are set as $\Delta I1$ and $\Delta Idif1$ and the variations corresponding to the threshold voltage $Vth2$ of the charge side are set as $\Delta I2$ and $\Delta Idif2$. On both the discharge side and the charge side, $\Delta I$ and $\Delta Idif$ are compared in size with the threshold value, and presence or absence of abnormality and the abnormality mode are identified.

Figure 7:
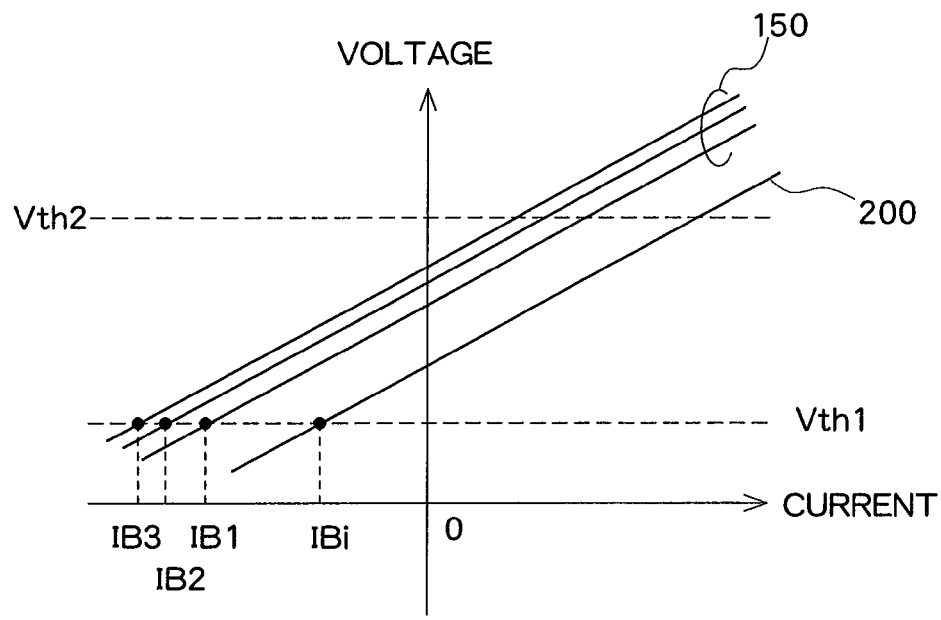
FIG. 7 is a graph showing a current-voltage characteristic when short-circuiting occurs.

FIG. 7 shows a current-voltage characteristic in the case of (1) short-circuiting. FIG. 7 is similar to FIG. 4, but differs from FIG. 4 in that a threshold voltage $Vth2$ is also set on the charge side (side of positive current) and the current is detected for each block on the charge side. When the discharge side is considered, if the absolute value of the difference between $IBi$ and $IB3$ among $IB1$~$IBn$ is the maximum, $\Delta I1$ is $|IB3 - IBi|$, which is compared in size to the threshold value, and it is determined that abnormality has occurred when the $\Delta I1$ exceeds the threshold value. This applies similarly on the charge side, and $\Delta I2 = |IB3 - IBi|$ which is compared in size with the threshold value, and it is determined that abnormality has occurred when $\Delta I2$ exceeds the threshold value. When $\Delta Idif$ is considered, from the definition of $\Delta Idif$, $\Delta Idif$ has a negative value when the representative current value of the abnormal block $Bi$ is larger than the average current value of all blocks and has a positive value when the representative current value of the abnormal block $Bi$ is smaller than the average current value. In FIG. 7, the representative current value $IBi$ of the abnormal block is at a more positive side than the normal blocks on the discharge side, and thus, $\Delta Idif1$ has a negative value. Similarly, on the charge side $\Delta Idif2$ has a negative value.

Figure 8:
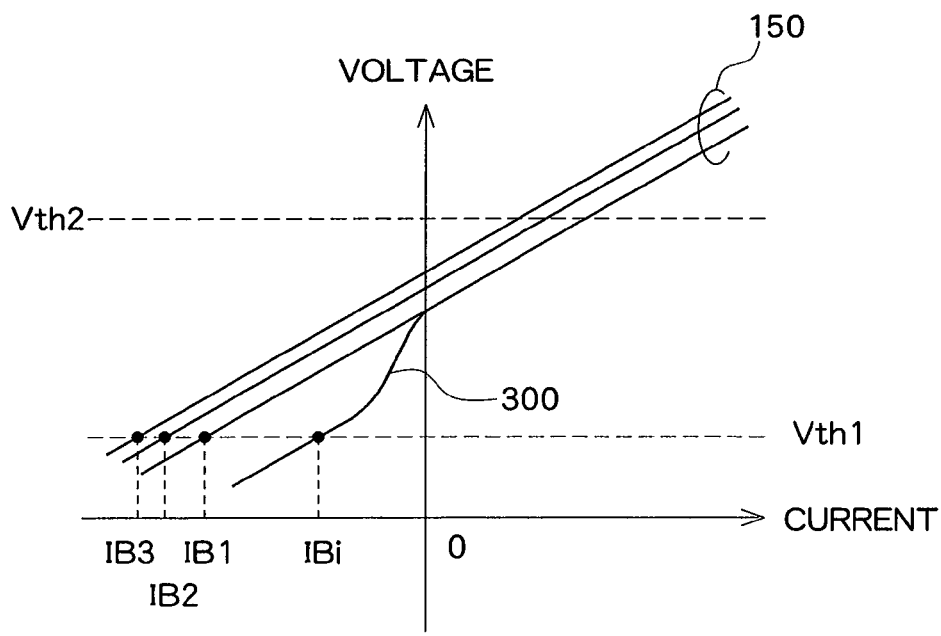
FIG. 8 is a graph showing a current-voltage characteristic when minute short-circuiting occurs.

FIG. 8 shows a current-voltage characteristic in the case of excessive discharge in the case of (2) minute short-circuiting and (4) capacitance reduction. FIG. 8 is similar to FIG. 5 except that the threshold voltage $Vth2$ is also set on the charge side, and the current is detected for each block on the charge side. When the discharge side is considered, $\Delta I1$ exceeds the threshold value and the abnormality of block $Bi$ is detected, but $\Delta I2$ is less than or equal to the threshold value. In addition, ΔIdif1 has a negative value similar to FIG. 7, but ΔIdif2 is within a normal range because the ΔI2 is less than or equal to the threshold value.

Figure 9:
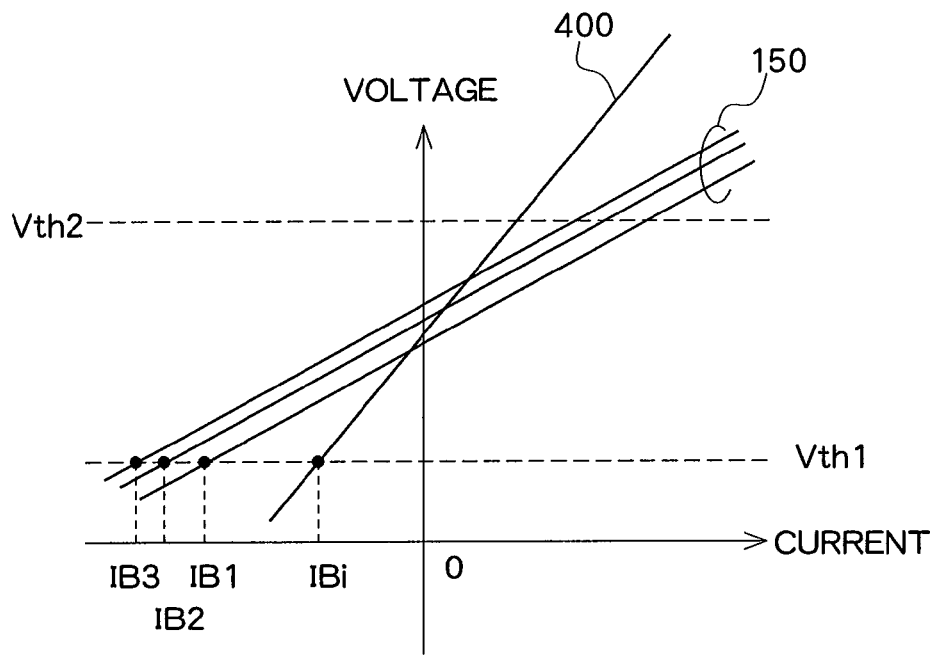
FIG. 9 is a graph showing a situation when IR is increased.

FIG. 9 shows a current-voltage characteristic for the cases of (3) IR increase, (5) temperature increase, and capacitance reduction of capacitor. FIG. 9 is similar to FIG. 6 except that the threshold voltage Vth2 is also set on the charge side and the current is detected for each block on the charge side. On the discharge side, ΔI1 exceeds the threshold value and abnormality of the block Bi is detected, and ΔIdif1 has a negative value. On the charge side, on the other hand, ΔI2 also exceeds the threshold value and abnormality in the block Bi is detected, and, because IBi is shifted to the negative side, ΔIdif2 has a positive value. In other words, signs of ΔIdif1 and ΔIdif2 have opposite polarities.

Figure 10:
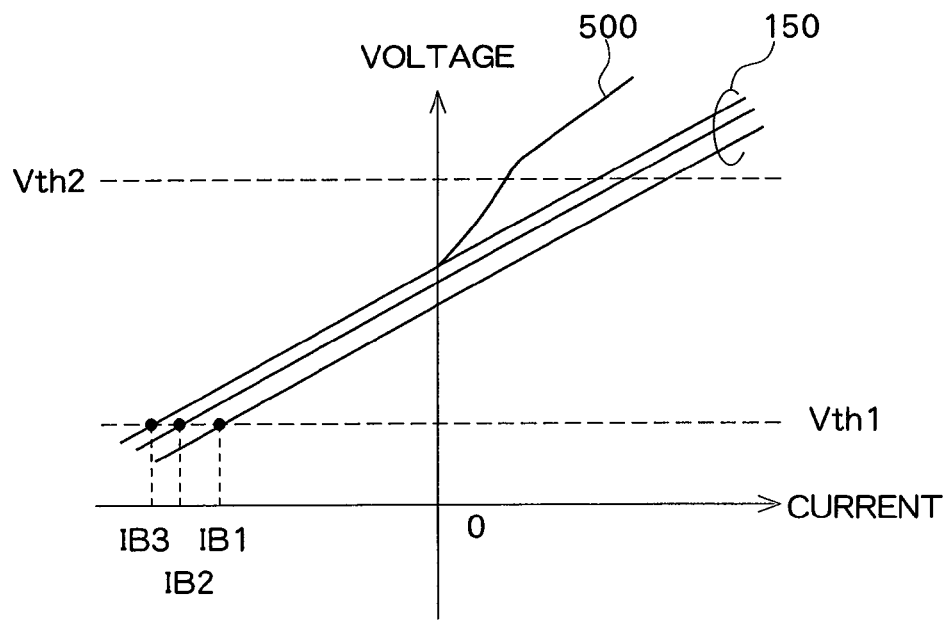
FIG. 10 is a graph showing a current-voltage characteristic when capacitance reduction (excessive charge) occurs.

FIG. 10 shows a current-voltage characteristic for the case of capacitance reduction and excessive charging. Similar to FIGS. 7-9, the threshold voltage Vth2 is set also on the side of the charge, in addition to the threshold voltage Vth1 on the discharge side. Reference numeral 500 represents a characteristic of the block Bi. On the discharge side, ΔI1 is less than or equal to the threshold value and is normal, but ΔI2 exceeds the threshold value and abnormality in the block Bi is detected. In addition, on the charge side, because IBi is shifted to the negative side, ΔIdif2 has a positive value.

Because the signs of ΔIdif1 and ΔIdif2 change according to the abnormality mode, the abnormality mode can be identified based on the change in the signs. FIG. 11 summarizes the result of comparison in size of ΔI1, ΔI2, ΔIdif1, and ΔIdif2 with the threshold value A. In FIG. 11, for example, when ΔI1 exceeds the threshold value A (YES) and the ΔI2 also exceeds the threshold value A (YES), if the sign of ΔIdif1 is negative, that is, ΔIdif<−A and the sign of ΔIdif2 is negative, that is, ΔIdif2<−A, it is determined that short-circuiting as shown in FIG. 7 has occurred. When, on the other hand, ΔI1 and ΔI2 exceed the threshold value, but the sign of ΔIdif1 is negative and the sign of ΔIdif2 is positive, that is, ΔIdif>A, it is determined that the IR increase, temperature increase, or capacitance reduction of the capacitor as shown in FIG. 9 has occurred. When, on the other hand, only ΔI1 exceeds the threshold value and ΔI2 is within the normal range, it is determined that excessive discharge has occurred due to the minute short-circuiting or the capacitance reduction as shown in FIG. 8. When only ΔI2 exceeds the threshold value and ΔI1 is within the normal range, it is determined that excessive charge state has occurred due to capacitance reduction shown in FIG. 10. Although the same value A is used for the threshold values of ΔI1, ΔI2, ΔIdif1, and ΔIdif2, it is also possible to employ different values depending on the malfunctions to be detected.

A person with ordinary skill in the art can think of various algorithms for identifying the abnormality mode by referring to FIG. 11. The present embodiment includes arbitrary algorithms for identifying the abnormality mode by combining ΔI2, ΔI2, ΔIdif1, and ΔIdif2. As is clear from FIG. 11, it is also possible to identify the abnormality mode based only on ΔIdif1 and ΔIdif2 without the use of ΔI1 and ΔI2.

In the present embodiment, a current value is obtained for each block at time when the voltage of the block becomes equal to a predetermined voltage. More specifically, the current values are obtained in S102 of FIG. 2 at times when the block voltages VB1~VBn have reached the threshold voltage Vth. The current value at the time of reaching the threshold voltage Vth does not require a strict simultaneity, and may be obtained within a certain allowable time range. Simultaneity within 100 msec would be sufficient for the simultaneity required for determining the abnormality of an electric storage battery. The allowable range of the simultaneity would be determined according to the precision required for the abnormality determination of the electric storage battery. When the electric storage battery is equipped in a hybrid vehicle, the drive carrier frequency of the hybrid motor is in the order of KHz, and according to Nyquist's theorem, theoretically, simultaneity of 1 msec or less is desired. Based on the experiences of the present inventors, however, the simultaneity of such a degree is not required, and the simultaneity of approximately 100 msec as described above is sufficient. It is also possible to set the allowable range of simultaneity from the viewpoint of securing precision necessary for reliably determining an abnormality mode having the highest priority among various abnormality modes of the electric storage battery. For example, when priority for the IR increase is particularly high among the abnormality modes, it is possible to set simultaneity necessary for reliably detecting an increase of IR of a predetermined amount or greater (for example, an amount of change ΔIR=10% compared to the normal value).

Figure 15:
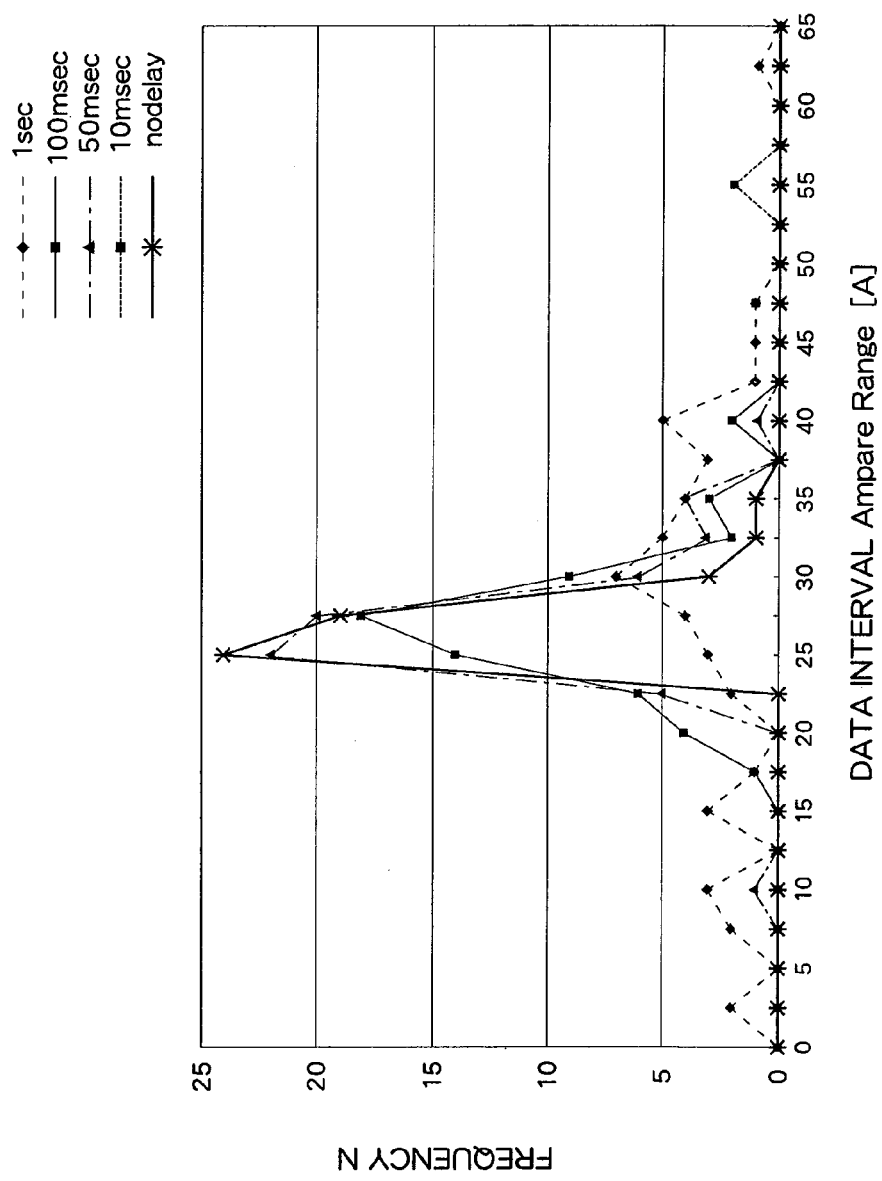
FIG. 15 is a graph showing a relationship between precision of simultaneity and distribution of current value.
Figure 16:
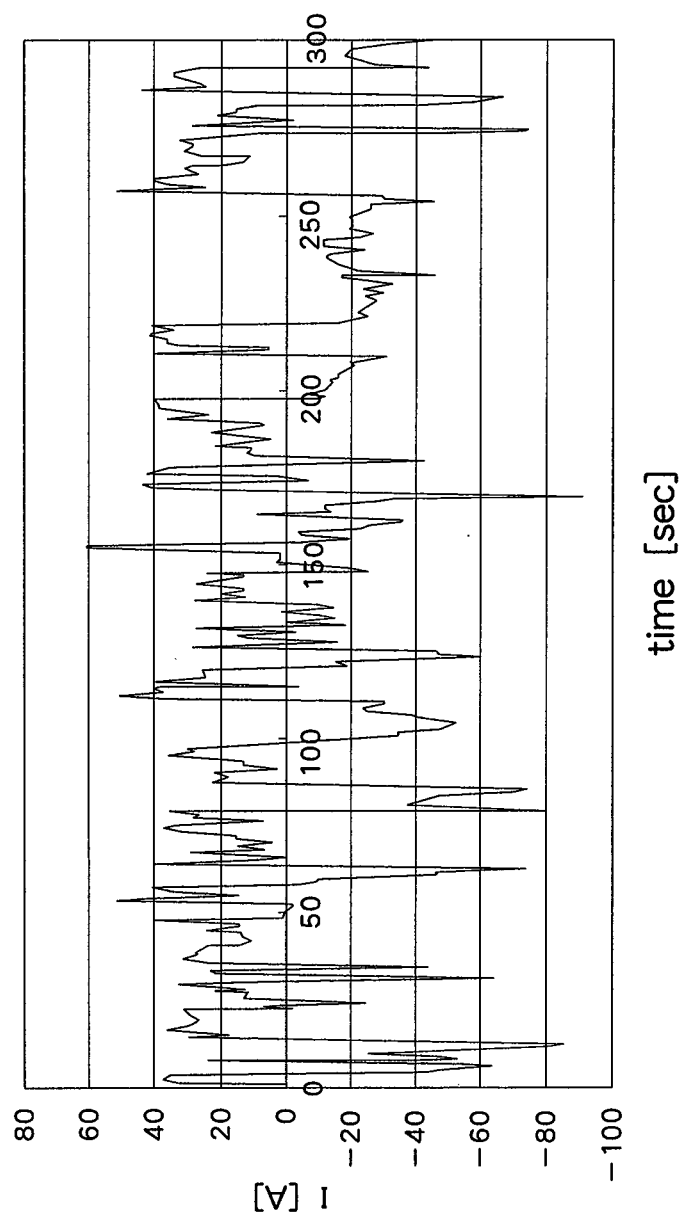
FIG. 16 is a current profile which is used in a simulation showing a relationship between the precision of simultaneity and distribution of current value.

In addition, in the present embodiment, the representative value of each block is calculated in S103 of FIG. 2, but it is also possible to calculate the representative value while removing a current value sample having a low precision when the representative value of each block is calculated, to improve the precision of the simultaneity. More specifically, it is determined whether or not the current value sample is to be included using a distribution of the current values for each block. More specifically, a configuration may be employed in which (a) a current value sample having a deviation of the current value which is larger, by a predetermined value or greater, than the distribution of the current values is removed from the samples for calculating the representative value, (b) the representative value itself is not calculated when the deviation of the current value distribution itself is large, etc. The condition of (b) can also be described in other words as calculating the representative value only when the deviation of the current value distribution itself is less than or equal to the predetermined value. FIG. 15 shows a simulation result showing a relationship between the precision of simultaneity and the current value distribution. FIG. 16 shows a current profile used in the simulation. In FIG. 15, current distributions are shown for times when there is no delay with respect to the time when the block voltage has reached the threshold voltage Vth (no delay), the delay is 10 msec, the delay is 50 msec, the delay is 100 msec, and the delay is 1 sec. While the distribution with the time with no delay has a standard deviation of 1.83 and variance of 3.35, the distribution with the delay of 1 sec has a standard deviation of 13.00 and a variance of 168.88, and thus the distribution is increased as the precision of simultaneity is reduced. By removing the current value samples using one of (a) or (b) described above, it is possible to improve the precision of the representative value of each block, that is, the precision of the simultaneity, in a simple manner, that is, without increasing the processing capability of the hardware. With such a configuration, the precision of the abnormality determination can be improved.

Specifically, the current at the time when the block voltage has reached the threshold voltage Vth can be sequentially stored by supplying outputs from the comparators 140-1 or the like in FIG. 1 to the determining unit 160, capturing the comparator output and the current value from the current sensor 180 at the determining unit 160 into a register, and transferring the current value stored in the register to the memory at the time when the comparator output changes. The comparator output may have, for example, 8 bits, and it is determined whether or not a previous value and the current value match. When the previous value and the current value do not match, it is determined that the comparator output has changed, that is, the block voltage has reached the threshold voltage Vth. In a strict sense, the current value at the timing when the comparator output has changed may be any time of immediately before the comparator output changes or immediately after the comparator output changes, or may be an average value of current values at the time immediately before the comparator output changes and the time immediately after the comparator output changes. In any case, it is sufficient that the simultaneity within the allowable range be secured, as described above.

In the present embodiment, the abnormality of the battery pack 100 is detected based on the current at the time when the block voltage has reached the threshold voltage Vth. Alternatively, it is also possible to detect the abnormality of the battery pack 100 based on a voltage difference between adjacent blocks rather than the block voltage of each block.

Figure 17:
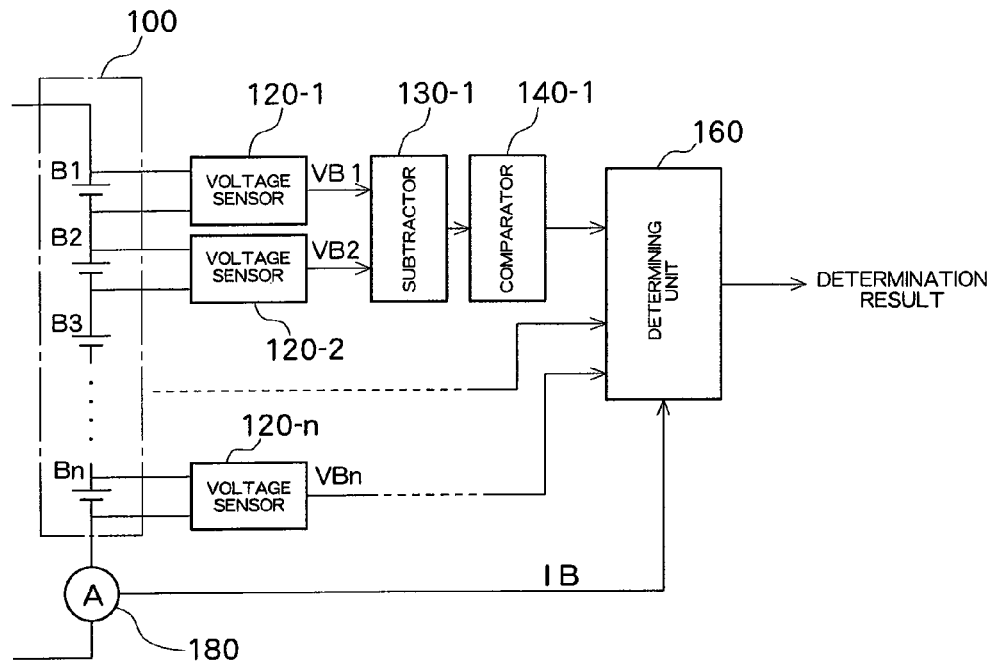
FIG. 17 is a structural diagram of an abnormality detecting device in another preferred embodiment of the present invention.

FIG. 17 shows a structure when the abnormality of the battery pack 100 is detected based on the voltage difference between adjacent blocks. A detected voltage VB1 from a voltage sensor 120-1 which detects the voltage of the block B1 and a detected voltage VB2 from a voltage sensor 120-2 which detects a voltage of the block B2 which is adjacent to the block B1 are both supplied to a subtractor 130-1. The subtractor 130-1 calculates a voltage difference VB1−VB2 between the block B1 and the block B2, and supplies the voltage difference to a comparator 140-1. The subtractor 130-1 may calculate VB2−VB1 as the voltage difference between adjacent blocks or may alternatively calculate VB1−VB2 or an absolute value of VB2−VB1. The comparator 140-1 compares the voltage difference supplied from the subtractor 130-1 with a predetermined threshold value VTH, and determines whether or not the voltage difference matches the predetermined threshold value VTH. Then, the comparator 140-1 supplies a match signal to a determining unit 160 at the time when the voltage difference matches the predetermined threshold value VTH. A plurality of subtractors 130-1 and comparators 140-1 are provided. The match signal supplied from the comparator 140-1 to the determining unit 160 functions as a sampling signal which defines a time when the current of the battery pack 100 is sampled.

Figure 18:
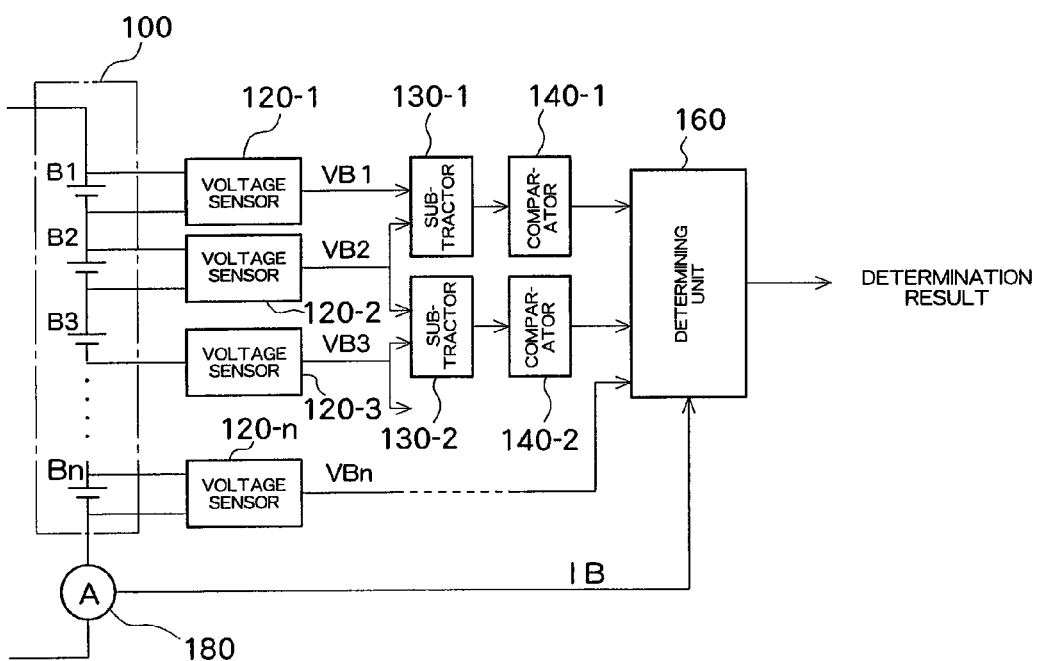
FIG. 18 is a structural diagram of an abnormality detecting device of yet another preferred embodiment of the present invention.

FIG. 18 shows another configuration when the abnormality of the battery pack 100 is detected based on the voltage difference between adjacent blocks. A detected voltage from a voltage sensor 120-1 which detects the voltage of the block B1 and a detected voltage VB2 from a voltage sensor 120-2 which detects the voltage of the block B2 adjacent to the block B1 are both supplied to a subtractor 130-1. In addition, the detected voltage VB2 from the voltage sensor 120-2 which detects the voltage of the block B2 is also branched and supplied to a subtractor 130-2. In addition, a detected voltage VB3 from a voltage sensor 120-3 which detects the voltage of the block B3 adjacent to the block B2 is supplied to the subtractor 130-2. The subtractor 130-1 calculates a voltage difference between the voltage VB1 and the voltage VB2, and supplies the voltage difference to a comparator 140-1. The subtractor 130-2 calculates a voltage difference between the voltage VB2 and the voltage VB3 and supplies the voltage difference to a comparator 140-2. The comparator 140-1 compares the voltage difference supplied from the subtractor 130-1 with a predetermined threshold value VTH, and determines whether or not the voltage difference matches the predetermined threshold value VTH. Then, the comparator 140-1 supplies a match signal to the determining unit 160 at a time when the voltage difference matches the threshold value VTH. Similarly, the comparator 140-2 compares the voltage difference supplied from the subtractor 130-2 with the predetermined threshold value VTH and determines whether or not the voltage difference matches the predetermined threshold value VTH. Then, the comparator 140-2 supplies a match signal to the determining unit 160 at a time when the voltage difference matches the threshold value VTH. In this configuration, if abnormality occurs in the block B2, for example, the abnormality affects not only the voltage difference calculated by the subtractor 130-1, but also the voltage difference calculated by the subtractor 130-2.

Figure 19:
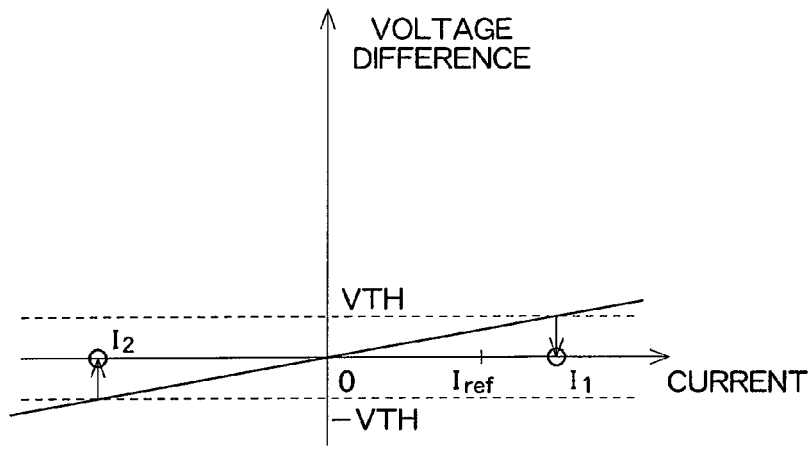
FIG. 19 is a graph showing a current-voltage difference characteristic during normal time.

FIG. 19 shows a result (characteristic diagram showing a relationship between current and voltage difference) of sampling a current value at a time when the voltage difference between adjacent blocks has reached the predetermined threshold value VTH. In FIG. 19, the horizontal axis represents the current value and the vertical axis represents the voltage difference. When the battery pack 100 is normal, as shown in FIG. 19, the voltage difference is a straight line through 0, and the values (absolute values) of current values I1 and I2 at the time when the voltage difference matches the threshold value VTH is greater than a reference current value Iref.

Figure 20:
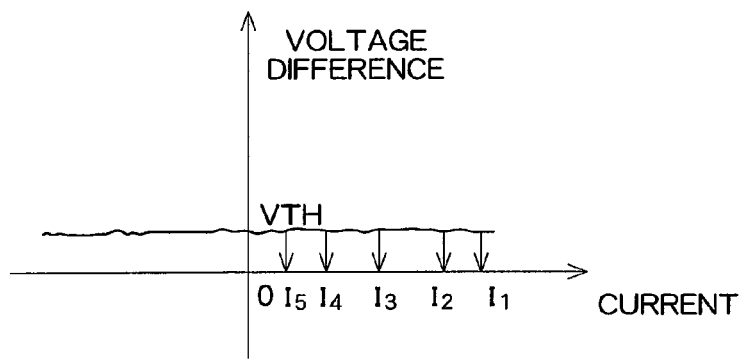
FIG. 20 is a graph showing a current-voltage difference characteristic when short-circuiting occurs.

FIG. 20 shows a characteristic diagram when the self short-circuiting occurs in the battery pack 100. As shown in FIG. 4, when self short-circuiting occurs, because the straight lines 150 and the straight line 200 have the same gradient, the voltage difference becomes approximately constant, the current values at the time when the voltage difference matches the threshold value VTH are detected as I1, I2, I3, I4, I5, etc., and a current value having a smaller absolute value to the reference current value Iref is detected.

Figure 21:
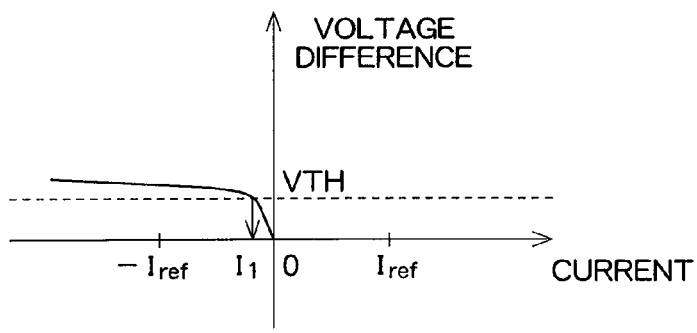
FIG. 21 is a graph showing a current-voltage difference characteristic when minute short-circuiting occurs.

FIG. 21 shows a characteristic diagram when the minute short-circuiting occurs in the battery pack 100. As shown in FIG. 5, when the minute short-circuiting occurs, because the voltage during discharge is reduced, the voltage difference has a characteristic of gradually increasing to the discharge side. The current value at the time when the voltage difference matches the threshold value VTH is detected as I1 (discharge side), and a current value I1 having a smaller absolute value than the reference current value Iref is detected.

Figure 22:
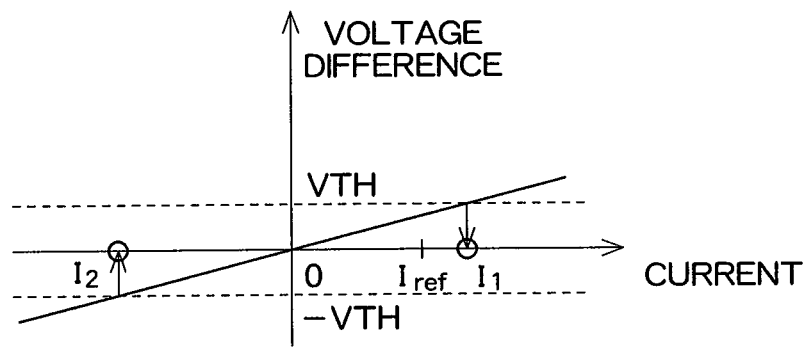
FIG. 22 is a graph showing a current-voltage difference characteristic in a situation when IR is increased.

FIG. 22 shows a characteristic diagram when the IR increase occurs in the battery pack 100. As shown in FIG. 6, when the IR increase occurs, the slope is increased, such as the straight line 400 compared to the normal straight lines 150. The voltage difference is a straight line passing through 0 similar to the normal case, but the slope is increased due to the IR increase. Thus, the absolute values of the current values I1 and I2 at the time when the voltage difference matches the threshold value VTH are gradually reduced. In other words, the degree of the IR increase can be evaluated based on the absolute values of the current values I1 and I2.

Figure 23:
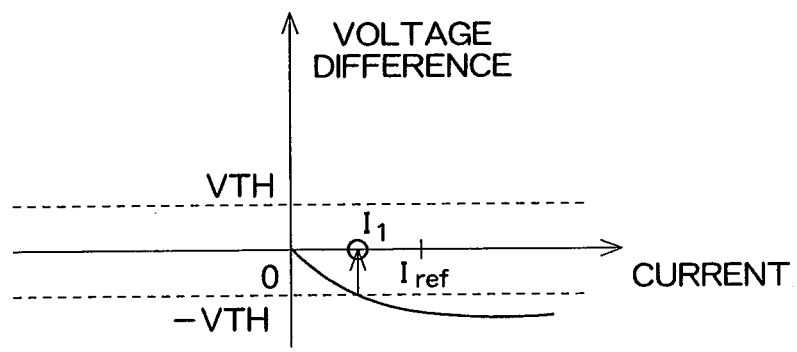
FIG. 23 is a graph showing a current-voltage difference characteristic when capacitance reduction (excessive charging) occurs.

FIG. 23 shows a characteristic diagram when a capacitance reduction (excessive charge) occurs in the battery pack 100. As shown in FIG. 10, when the capacitance reduction (excessive charge) occurs, the voltage is increased on the charge side, and thus in the characteristic, the voltage difference gradually increases on the charge side. The current value at the time when the voltage difference matches the threshold value VTH is detected as I1 (charge side), and a current value I1 having a smaller absolute value than the reference current value Iref is detected.

As described, the size of the current value (absolute value) at the time when the voltage difference matches the threshold value VTH and the reference current value Iref are compared in size, and when the absolute value of the detected current value is larger than the reference current value Iref, it is determined that the battery pack 100 is normal, and when the absolute value of the detected current value is smaller than the reference voltage value Iref, it is determined that abnormality has occurred in the battery pack 100. In addition, even when the absolute value of the detected current value is greater than the reference current value Iref, if the value is small (that is, the value is close to the reference current value), it is possible to determine that the internal resistance is increasing.

With the circuit structure of FIG. 17, it is not possible, even when abnormality has occurred in the block B2, for example, to determine in which of the blocks B1 and B2 the abnormality has occurred. However, with the structure of FIG. 18, because the voltage difference VB2–VB3 is calculated in addition to the voltage difference VB1–VB2, it is possible to determine that the abnormality has occurred in the block B2, instead of the block B1.

As described, the abnormality of the battery pack 100 can be detected by detecting a current value at a time when the voltage difference between adjacent blocks has reached a predetermined threshold value VTH, and comparing in size the current value with the reference current value Iref. In FIGS. 19-23, VB1–VB2 or the like is used as the voltage difference, but it is also possible to use the absolute value. When the voltage difference between adjacent blocks is used, a circuit for detecting a voltage difference would be newly required. However, when the battery pack 100 is equipped in a hybrid vehicle as a lithium-ion battery, a structure is employed in which a plurality of blocks are managed with a single IC, and thus it is possible to provide the voltage difference detecting circuit inside the IC.

The invention claimed is:

1. A detecting device which detects abnormality of an electric storage device having a plurality of blocks which are connected in series, each block having one or a plurality of electric storage units, the detecting device comprising:
    a voltage sensor which detects a block voltage of each block during increases and decreases of each block voltage during charging and discharging of the electric storage device;
    a comparator which compares the detected block voltage of each block with a threshold voltage selected from a normal voltage change range of the blocks during charging and discharging of the electric storage device;
    a measurement unit which measures a current value of the electric storage device substantially simultaneously after the comparator detects the block voltage is equal to the threshold voltage, for each block;
    a determining unit which stores the measured current value that is measured substantially simultaneously after the comparator detects the block voltage is equal to the threshold voltage, for each block, and calculates a representative current value of each block after storing two or more current values for each block, wherein the stored current values include values measured at times when the electric storage device is being charged and discharged; and
    a detecting unit which, after the calculation of a representative current value for different blocks, detects abnormality of the electric storage device by comparing of the representative current values of different blocks to one another, and determining whether a deviation between representative current values is greater than a threshold value.

2. The abnormality detecting device for an electric storage device according to claim 1, wherein the detecting unit comprises:
    a calculating unit which calculates a representative current value of each block through a predetermined statistical process based on a plurality of the measured current values of each block; and
    a comparing unit which compares a deviation of the calculated representative current value of each block with a predetermined value to detect abnormality of the electric storage device.

3. The abnormality detecting device for an electric storage device according to claim 2, wherein the representative value is one of an average value, an intermediate value, a minimum value, and a maximum value of the plurality of the current values of each block.

4. The abnormality detecting device for an electric storage device according to claim 2, wherein the calculating unit extracts only a current value within a predetermined range from among the plurality of measured current values of each block and calculates the representative value of each block through the predetermined statistical process.

5. The abnormality detecting device for an electric storage device according to claim 2, wherein the calculating unit calculates the representative current value only for a plurality of current values having a distribution degree of a predetermined value or less, among the plurality of measured current values of each block.

6. The abnormality detecting device for an electric storage device according to claim 1, wherein the detecting unit detects, as the abnormality, at least one of short-circuiting, increase in internal resistance, and reduction in capacitance.

7. The abnormality detecting device for an electric storage device according to claim 1, wherein the electric storage device is one of a battery and a capacitor.

8. The abnormality detecting device for an electric storage device according to claim 1, wherein as the predetermined voltage, at least two predetermined voltages including a first predetermined voltage and a second predetermined voltage are set; and
    the detecting unit detects the abnormality of the electric storage device based on a deviation of the current value of each block at a time when the voltage becomes equal to the first predetermined voltage and a deviation of the current value of each block at a time when the voltage becomes equal to the second predetermined voltage.

9. The abnormality detecting device for an electric storage device according to claim 1, wherein the measurement unit measures a current value having a time lag within 100 msec as the current value at the time when the voltage of the block becomes equal to the predetermined voltage.

10. A method of detecting abnormality of an electric storage device having a plurality of blocks which are connected in series, each block having one or a plurality of electric storage units, the method comprising the steps of:
    sensing a block voltage of each block during increases and decreases of each block voltage during charging and discharging of the electric storage device;
    comparing a detected block voltage of each block with a threshold voltage selected from a normal voltage change range of the blocks during charging and discharging of the electric storage device;
    measuring a current value of the electric storage device substantially simultaneously after the comparator detects the block voltage is equal to the threshold voltage, for each block;
    storing the measured current value that is measured substantially simultaneously after the comparator detects the block voltage is equal to the threshold voltage, for each block;

calculating a representative current value of each block after storing two or more current values for each block, wherein the stored current values include values measured at times when the electric storage device is being charged and discharged; and after the calculation of a representative current value for different blocks, detecting abnormality of the electric storage device by comparing the representative current values of different blocks to one another, and determining whether a deviation between representative current values is greater than a threshold value.

11. A non-transitory computer-readable recording medium storing a computer program for detecting abnormality of an electric storage device having a plurality of blocks which are connected in series, each block having one or a plurality of electric storage units, which, when executed, causes a computer to execute a process comprising:

sensing a block voltage of each block during increases and decreases of each block voltage during charging and discharging of the electric storage device;

comparing a detected block voltage of each block with a threshold voltage selected from a normal voltage change range of the blocks during charging and discharging of the electric storage device;

measuring a current value of the electric storage device substantially simultaneous after the comparator detects the block voltage is equal to the threshold voltage, for each block;

sequentially storing in a memory each measured current value that is measured substantially simultaneous after the comparator detects the block voltage is equal to the threshold voltage, for each block;

causing a calculating device to calculate a representative current value for each block through a predetermined statistical process based on a plurality of the current values for each block stored in the memory, wherein the stored current values include values measured at times when the electric storage device is being charged and discharged;

after the calculation of a representative current value for different blocks, causing the calculating device to calculate a deviation of the representative current values between different blocks; and detecting abnormality of the electric storage device by comparing in size the deviation obtained through the calculation with a threshold value.

12. A detecting device which detects abnormality of an electric storage device having a plurality of blocks which are connected in series, each block having one or a plurality of electric storage units, the detecting device comprising:

a voltage sensor which detects a block voltage of each block;

a comparator which compares detected block voltages between a pair of adjacent blocks;

a measurement unit which measures a current value of the electric storage device substantially simultaneously after the comparator detects the adjacent block voltages differ from each other by the threshold voltage for each pair of adjacent blocks;

a determining unit which stores the measured current value that is measured substantially simultaneously after the comparator detects the adjacent block voltages differ from each other by the threshold voltage for each pair of adjacent blocks; and a detecting unit which detects abnormality of the electric storage device by comparing a size of the stored current values with a threshold value.

13. The abnormality detecting device for electric storage device according to claim 12, wherein the detecting unit detects, as the abnormality, at least one of short-circuiting, increase in internal resistance, and reduction of capacitance.

14. The abnormality detecting device for electric storage device according to claim 12, wherein the electric storage device is one of a battery and a capacitor.

* * * * *

UNITED STATES PATENT AND TRADEMARK OFFICE
CERTIFICATE OF CORRECTION

| | | |
|---|---|---|
| PATENT NO. | : 8,463,562 B2 | Page 1 of 1 |
| APPLICATION NO. | : 12/525069 | |
| DATED | : June 11, 2013 | |
| INVENTOR(S) | : T. Nakanishi | |

It is certified that error appears in the above-identified patent and that said Letters Patent is hereby corrected as shown below:

COLUMN     LINE

In the Claims 15        60        "comparing of the" should read --comparing the--
(Claim 1,   line 28)

Signed and Sealed this
Twenty-ninth Day of April, 2014

Michelle K. Lee
*Deputy Director of the United States Patent and Trademark Office*